United States Patent [19]
Yamada

[11] Patent Number: 5,923,070
[45] Date of Patent: Jul. 13, 1999

[54] SEMICONDUCTOR DEVICE HAVING AN ELEMENT INCLUSION REGION FOR REDUCING STRESS CAUSED BY LATTICE MISMATCH

[75] Inventor: Keiichi Yamada, Tokyo, Japan

[73] Assignee: Mitsubishi Denki Kabushiki Kaisha, Tokyo, Japan

[21] Appl. No.: 08/937,002

[22] Filed: Sep. 24, 1997

[30] Foreign Application Priority Data

Mar. 19, 1997 [JP] Japan ..................... 9-066358

[51] Int. Cl.[6] .................. H01L 29/76; H01L 27/082; H01L 29/30
[52] U.S. Cl. .................. 257/408; 257/384; 257/590; 257/617
[58] Field of Search .................. 257/408, 412–413, 257/384, 383, 382, 376, 590, 617, 190; 438/527, 528

[56] References Cited

U.S. PATENT DOCUMENTS

| | | | |
|---|---|---|---|
| 5,137,838 | 8/1992 | Ramde et al. | 438/499 |
| 5,266,510 | 11/1993 | Lee | 438/298 |
| 5,554,871 | 9/1996 | Yamashita et al. | 257/336 |
| 5,557,129 | 9/1996 | Oda et al. | 257/345 |
| 5,710,438 | 1/1998 | Oda et al. | 257/382 |

OTHER PUBLICATIONS

A. Murakoshi, et al., "Analysis of Interface Structure for Ultra–low Contact Resistivity", Extended Abstracts (The 57th Autumn Meeting, 1996); The Japan Society of Applied Physics, No. 2, Sep. 7, 1996, p. 593.

J.C. Phillips, "Bonds and Bands in Semiconductors", Academic Press New York and London, 1973, pp. 20–23.

Primary Examiner—Minh Loan Tran
Assistant Examiner—Hung K. Vu
Attorney, Agent, or Firm—Oblon, Spivak, McClelland, Maier & Neustadt, P.C.

[57] ABSTRACT

A semiconductor device improves its electrical characteristics by reducing crystal defects in the vicinity of junction interfaces between a semiconductor layer, and a metal compound layer composed of semiconductor and metal elements, and between an epitaxial layer and its forming substrate. A pair of source/drain layers (52) are separately formed in a surface of a well layer (50), and a metal silicide layer (8) is formed thereon. A nitrogen inclusion region (9) is formed in the vicinity of a junction interface between the source/drain layers (52) and the metal silicide layer (8).

16 Claims, 6 Drawing Sheets

SEMICONDUCTOR DEVICE HAVING AN ELEMENT INCLUSION REGION FOR REDUCING STRESS CAUSED BY LATTICE MISMATCH

BACKGROUND OF THE INVENTION

1. Field of the Invention

This invention is directed to a semiconductor device, in particular to that preventing crystal defects.

2. Description of the Background Art

A higher performance of a semiconductor device requires suppression of junction leakage current and parasitic resistance.

The parasitic resistance of the semiconductor device includes such as source/drain resistance and contact resistance connecting a metal wire and a semiconductor region. A metal silicide has been employed to reduce such resistance.

<MOSFET>

FIG. 11 shows a metal silicide formed on a surface of source/drain layers of a MOS field effect transistor 90 (MOSFET).

In FIG. 11, a P-type well layer 50 is formed to a predetermined depth in a surface of a silicon substrate 1. An isolation film 2 (field oxide film), which defines an active area 5, is selectively formed on a surface of the P-type well layer 50.

Further, a pair of source/drain layers 52 are separately formed in parallel in the surface of the P-type well layer 50, and a metal silicide layer 8 is formed thereon.

Further, a pair of lightly doped drain layers 51 (hereinafter referred to as LDD layers) are provided so as to adjoin to each edge of the source/drain layers 52 which face each other.

A gate oxide film 3 is formed on the P-type well layer 50 between the LDD layers 51, and a gate electrode 4 and the metal silicide layer 8 are formed thereon.

Further, sidewall oxide films 6 are formed at side surfaces of the gate oxide film 3, the gate electrode 4 and the metal silicide layer 8. The P-type well layer 50 also includes a channel doped layer 53 under the gate electrode 4, and a channel cut layer 54.

The metal silicide layer 8 is a cobalt silicide layer obtained by forming a metal thin film, such as a cobalt thin film, in the source/drain layers 52 and inducing a cobalt-silicon reaction by thermal processing. Here, titanium, nickel or tungsten may be used as a metal, instead of cobalt.

In such semiconductor device 90, a crystal defect 7 is likely to take place due to distortion caused by a difference of crystal arrangements (i.e., lattice mismatch) between $CoSi_2$ and a single crystalline silicon in the vicinity of a junction interface between the metal silicide layer 8 (cobalt silicide layer) and the source/drain layers 52 (silicon layers).

FIG. 12 schematically shows the vicinity of a junction interface between the cobalt silicide layer and the silicon layer. As shown in FIG. 12, a cobalt silicide layer 22 has a crystal structure with cobalt atoms partially included in a configuration of silicon atoms.

As a bond length of the cobalt atom is longer than that of the silicon atom, the inclusion of cobalt atoms acts to change crystal arrangements, causing crystal defects. In FIG. 12, a difference of the bond lengths is indicated by the size of circles.

The crystal defects bring about dangling bonds as some of the silicon atoms in the cobalt silicide layer 22 and a silicon layer 21 have unused bonds, which affects electrical characteristics of the semiconductor device.

In particular, the crystal defect 7 in the source/drain layers causes leakage current in the semiconductor device, deteriorating electrical characteristics of the semiconductor device. This results in deterioration in refresh characteristics in a dynamic RAM (DRAM) and an increase in power consumption in a logic circuit, and has been a fatal problem for a high-performance semiconductor device.

<Epitaxial Substrate>

Moreover, the semiconductor device may use an epitaxial substrate, for example, in order to improve latch-up immunity in a CMOS device structure. The epitaxial substrate is provided by forming an epitaxial layer on a silicon substrate which has low resistance with high-concentration impurity introduction (up to $1 \times 10^{19}$ $cm^{-3}$). In general, impurity concentration of the epitaxial layer is much lower than that of the silicon substrate. Thus, lower the resistance of the silicon substrate is, in other words, higher the impurity concentration thereof is, more improvement can be obtained in latch-up immunity of the semiconductor device formed in the epitaxial layer.

However, the impurity concentration of the silicon epitaxial substrate presently used is about $1 \times 10^{19}$ $cm^{-3}$ maximum. At higher concentration, misfit dislocations take place between the silicon substrate and the epitaxial layer, causing deterioration in carrier lifetime in the epitaxial layer and an increase in leakage current.

FIG. 13 schematically shows the vicinity of a junction interface between the silicon substrate and the epitaxial layer. As shown in FIG. 13, impurity ions (boron in this case) are introduced into a silicon substrate 23 much more than into an epitaxial layer 24.

As a bond length of the boron atom is shorter than that of the silicon atom, crystal arrangements differ between the silicon substrate 23 including a large number of boron atoms and the epitaxial layer 24 including a small number of them. This lattice mismatch causes crystal defects. In FIG. 13, a difference of the bond lengths is schematically indicated by the size of circles.

FIG. 14 shows an epitaxial substrate 190 which is experimentally produced as the silicon epitaxial substrate. In FIG. 14, an epitaxial layer 10 is formed, by epitaxial growth, on a P-type silicon substrate 11 in which boron is doped to a maximum concentration of about $1 \times 10^{20}$ $cm^{-3}$. Boron is also doped in the expitaxial layer 10 to a maximum concentration of about $1 \times 10^{15}$ $cm^{-3}$.

The introduction of a high-concentration impurity into the silicon substrate 11 causes crystal defects at an interface between the epitaxial layer 10 and the silicon substrate 11. In a conventional method, the impurity concentration of the silicon substrate 11 has been limited to $1 \times 10^{19}$ $cm^{-3}$ or less in order to prevent the crystal defect 7.

As described above, in the conventional semiconductor device, crystal defect caused by distortion due to lattice mismatch at a junction interface between a semiconductor layer and a metal silicide layer composed of semiconductors and metals causes deterioration in electrical characteristics of the semiconductor device.

Further, in the use of the epitaxial substrate, too high impurity concentration of a forming substrate for the epitaxial layer causes crystal defects due to misfit dislocations, in the epitaxial layer. This results in deterioration in carrier lifetime in the epitaxial layer and an increase in leakage current, thus preventing improvement in electrical characteristics of the semiconductor device, especially in latch-up immunity, by limiting an increase in the impurity concentration of the forming substrate.

SUMMARY OF THE INVENTION

The present invention is directed to a semiconductor device. The semiconductor device according to a first aspect of the present invention comprises: a junction structure of a crystalline semiconductor layer and a metal compound layer composed of a metal element and a semiconductor element constituting said semiconductor layer; and a first element inclusion region with a first element introduced in the vicinity of a junction interface between the semiconductor layer and the metal compound layer, the first element having a bond length shorter than the semiconductor element and having a characteristic that the presence of the first element does not cause deterioration in electrical characteristics of the semiconductor layer.

Preferably, in a second aspect of the present invention, concentration ratio between the metal element and the first element is defined as X:(1−X), the concentration ratio X of the metal element expressed by the following equation (1);

$$X = X_0 = \frac{\frac{r1}{rb} - 1}{\frac{ra}{rb} - 1} \quad (1)$$

where r1, ra and rb are bond lengths of the semiconductor element, the metal element and the first element, respectively.

Preferably, in a third aspect of the present invention, the first element includes an element which can generate an electron or a hole when introduced into the semiconductor layer.

Preferably, in a fourth aspect of the present invention, the first element includes an element which would not generate an electron and a hole when introduced into the semiconductor layer.

Preferably, in a fifth aspect of the present invention, the first element includes an element of group IV in the periodic table.

Preferably, in a sixth aspect of the present invention, the first element inclusion region has concentration distribution of the first element higher in the metal compound layer than in the semiconductor layer.

A semiconductor device of an seventh aspect of the present invention comprises: a first semiconductor layer of relatively high impurity concentration, second semiconductor layer of relatively low impurity concentration, formed on the whole surface of the first semiconductor layer so that the crystallinity of the first semiconductor layer is reflected to the second semiconductor layer; and a first element inclusion region with a first element introduced in the vicinity of a junction interface between the first and the second semiconductor layers, the first element having a bond length longer than the semiconductor element which constitutes the first semiconductor layer, and having a characteristic that the presence of the first element does not cause deterioration in electrical characteristics of the semiconductor layers, wherein the first semiconductor layer includes an impurity element whose bond length is shorter than that of the semiconductor element.

A semiconductor device of a eighth aspect of the present invention comprises: a first semiconductor layer of relatively high impurity concentration, which has crystallinity; a second semiconductor layer of relatively low impurity concentration, formed on the whole surface of the first semiconductor layer so that the crystallinity of the semiconductor layer is reflected to the second semiconductor layer; and a first element inclusion region with a first element introduced in the vicinity of a junction interface between the first and the second semiconductor layers, the first element having a bond length shorter than the semiconductor element which constitutes the first semiconductor layer, and having a characteristic that the presence of the first element does not cause deterioration in electrical characteristics of the semiconductor layer, wherein the first semiconductor layer includes an impurity element whose bond length is longer than that of the semiconductor element.

Preferably, in a ninth aspect of the present invention, concentration ratio between the first element and the impurity element is defined as X:(1−X), the concentration ratio X of the first element expressed by the following equation (1);

$$X = X_0 = \frac{\frac{r1}{rb} - 1}{\frac{ra}{rb} - 1} \quad (1)$$

where r1, ra and rb are bond lengths of the semiconductor element, the first impurity element and the first element, respectively.

Preferably, in a tenth aspect of the present invention, the first element includes an element which can generate an electron or a hole when introduced into the first and the second semiconductor layers.

Preferably, in a eleventh aspect of the present invention, the first element includes an element which would not generate an electron and a hole when introduced into the first and the second semiconductor layers.

Preferably, in a twelfth aspect of the present invention, the first element includes an element of group IV in the periodic table.

According to the semiconductor device of the first aspect of the present invention, when the first element inclusion region is provided in the vicinity of the junction interface between the semiconductor layer and the metal compound layer, the first element is included in the crystal of the semiconductor layer. This relieves lattice mismatch due to the metal element included in the crystal of the semiconductor layer, thereby relieving stress or distortion in the crystal and thus preventing crystal defects. Thus, with the source/drain layers of a MOSFET as the semiconductor layer and the metal silicide layer as the metal compound layer, it becomes possible to prevent crystal defects in the source/drain layers as well as to reduce leakage current.

According to the semiconductor device of the second aspect of the present invention, as the concentration ratio between the metal element and the first element can be found by the bond lengths of each element, it is possible to obtain effective concentration of the first element for relieving lattice mismatch.

According to the semiconductor device of the third aspect of the present invention, deterioration in electrical characteristics of the semiconductor device due to the first element can be prevented by selecting the first element depending on the conductivity type of the semiconductor device. That is, an element which can generate an electron is useful for the N-type semiconductor layer, while an element which can generate a hole is useful for the P-type semiconductor layer.

For example, low contact resistance of metal-Si contact is obtained by adding the first element which is the same doping type as the semiconductor region in the vicinity of the metal-silicon interface. High doping concentration is necessary to low contact resistance. Donor type as the first element is most effective to metal-n-type Si contact structure. (Acceptor type is most effective to metal-p-type Si.)

According to the semiconductor device of the fourth aspect of the present invention, deterioration in electrical characteristics of the semiconductor layer due to the first element can be prevented and precise control of carrier concentration and electrical conductivity type is achieved by employing as the first element an element which would not generate an electron and a hole, such as fluorine, neon, argon, krypton and xenon.

According to the semiconductor device of the fifth aspect of the present invention, stability of semiconductor property is achieved by employing an element of group IV in the periodic table, such as C, Si, Ge, if very high doping concentration of the first element atom is necessary to suppress generation of lattice mismatch.

According to the semiconductor device of the sixth aspect of the present invention, the crystallinity in the metal compound layer can be improved with concentration of the first element higher in the semiconductor layer than in the metal compound layer.

According to the seventh aspect of the present invention, the semiconductor device includes the first element inclusion region including the first element, whose bond length is higher than that of the semiconductor element, when the bond length of the impurity element is shorter than that of the semiconductor element. That is, the first element is included in the crystal of the first semiconductor layer. This relieves lattice mismatch due to the impurity element included in the first semiconductor layer, thereby relieving stress or distortion in the crystal and thus preventing crystal defects. Therefore, with the single crystalline silicon substrate as the first semiconductor layer and the epitaxial layer as the second semiconductor layer, lattice mismatch between the first and the second semiconductor layers can be relieved, which relieves stress or distortion in the crystal and thus prevents crystal defects due to misfit dislocations. This makes it possible to prevent deterioration in carrier lifetime of the epitaxial layer and an increase in leakage current.

According to the eighth aspect of the present invention, the semiconductor device includes the first element inclusion region including the first element, whose bond length is shorter than that of the semiconductor element, when the bond length of the impurity element is longer than that of the semiconductor element. That is, the first element is included in the crystal of the first semiconductor layer. This relieves lattice mismatch due to the impurity element included in the first semiconductor layer, thereby relieving stress or distortion in the crystal and thus preventing crystal defects. Therefore, with the single crystalline silicon substrate and the epitaxial layer as the first and the second semiconductor layers, respectively, lattice mismatch between the two layers can be relieved, which relieves stress or distortion in the crystal and thus prevents crystal defects due to misfit dislocations. This makes it possible to prevent deterioration in carrier lifetime of the epitaxial layer and an increase in leakage current.

According to the semiconductor device of the ninth aspect of the present invention, as the concentration ratio between the first element and the impurity element can be obtained by the bond lengths of each element, it is possible to obtain effective concentration of the first element for relieving lattice mismatch.

According to the semiconductor device of the tenth aspect of the present invention, deterioration in electrical characteristics of the semiconductor layer due to the first element can be prevented by selecting the first element depending on the conductivity types of the first and the second semiconductor layers. For example, an element which can generate electrons is useful for the N-type first semiconductor layer, while an element which can generate holes is useful for the P-type first semiconductor layer. For example, low contact resistance of metal-Si contact is obtained by adding the first element which is the same doping type as the semiconductor region in the vicinity of the metal-silicon interface. High doping concentration is necessary to low contact resistance. Donor type as the first element is most effective to metal-n-type Si contact structure. (Acceptor type is most effective to metal-p-type Si.)

According to the semiconductor device of the eleventh aspect of the present invention, deterioration in electrical characteristics of the first and the second semiconductor layers due to the first element can be prevented and precise control of carrier concentration and electrical conductivity type is achieved by employing as the first element an element which would not generate an electron and a hole such as fluorine, neon, argon, krypton, and xenon.

According to the semiconductor device of the twelfth aspect of the present invention, stability of semiconductor property is achieved by employing an element of group IV in the periodic table, such as C, Si, Ge, if very high doping concentration of the first element atom is necessary to suppress generation of lattice mismatch.

The present invention provides the semiconductor device which improves its electrical characteristics by preventing crystal defects in the junction interfaces between the semiconductor layer and the metal compound layer composed of semiconductors and metals, and between the epitaxial layer and its forming substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
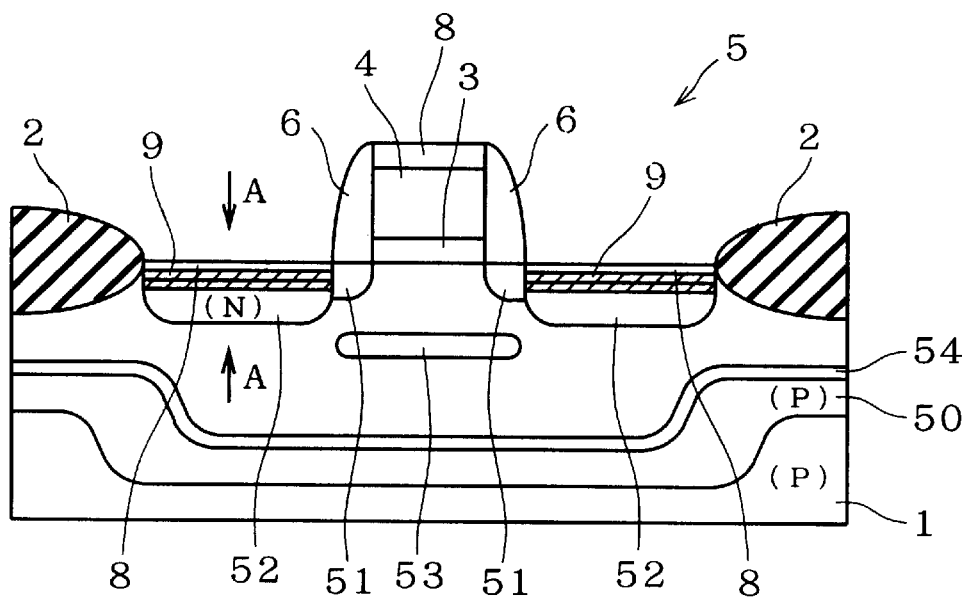
FIG. 1 is a sectional view showing a structure of a semiconductor device according to a first preferred embodiment of the present invention.

FIG. 1 shows a sectional structure of an N-type MOS field effect transistor 100 (MOSFET) in accordance with a first preferred embodiment of the present invention.

In FIG. 1, a P-type well layer 50 is formed to a predetermined depth in a surface of a P-type silicon substrate 1. An isolation film 2 (field oxide film), which defines an active area 5, is selectively formed on a surface of the P-type well layer 50.

Further, a pair of source/drain layers 52 are separately formed in parallel in the surface of the P-type well layer 50, and a metal silicide layer 8 is formed on the source/drain layers 52, respectively. Then, nitrogen inclusion region 9 (first element inclusion region) is formed in the vicinity of a junction interface between the source/drain layers 52 and the metal silicide layer 8.

Further, a pair of lightly doped drain layers 51 (hereinafter referred to as LDD layers) are provided so as to adjoin to each edge of the source/drain layers 52 which face each other.

A gate oxide film 3 is formed on the P-type well layer 50 between the LDD layers 51, and a gate electrode 4 and the metal silicide layer 8 are formed thereon.

Sidewall oxide films 6 are formed at side surfaces of the gate oxide film 3, the gate electrode 4 and the metal silicide layer 8. The P-type well layer 50 also includes a channel doped layer 53 under the gate electrode 4, and a channel cut layer 54.

The metal silicide layer 8 is a cobalt silicide layer obtained by forming a metal thin film, such as a cobalt thin film, in the source/drain layers 52 and inducing a cobalt-silicon reaction with heat treatment. The ratio of silicon to cobalt in the cobalt silicide layer is approximately 2:1, so the layer is written as $CoSi_2$.

Now, components of the MOSFET 100 are described. Boron is doped into the P-type silicon substrate 1 to a concentration of about $1\times10^{15}$ cm$^{-3}$. Then, the P-type well layer 50, the channel cut layer 54, and the channel doped layer 53 are formed by boron ion implantation at a dose of $3\times10^{12}$ cm$^{-2}$ at 250 KeV, at a dose of $2\times10^{12}$ cm$^{-2}$ at 10 keV, and at a dose of $9\times10^{12}$ cm$^{-2}$ at 50 keV, respectively.

Phosphorus is doped into the LDD layers 51 to a concentration of about $8\times10^{17}$ cm$^{-3}$, and arsenic is doped into the source/drain layers 52 to a maximum concentration of about $2\times10^{21}$ cm$^{-3}$.

The discrete insulating film 2 and the gate oxide film 3 are formed of 300 nm and 10 nm silicon oxide films, respectively.

Further, the gate electrode 4 is formed of a polysilicon film in which phosphorus is doped to a concentration of about $4\times10^{20}$ cm$^{-3}$.

The nitrogen inclusion region 9 is doped with nitrogen to a maximum concentration of about $9.9\times10^{21}$ cm$^{-3}$.

Figure 2:
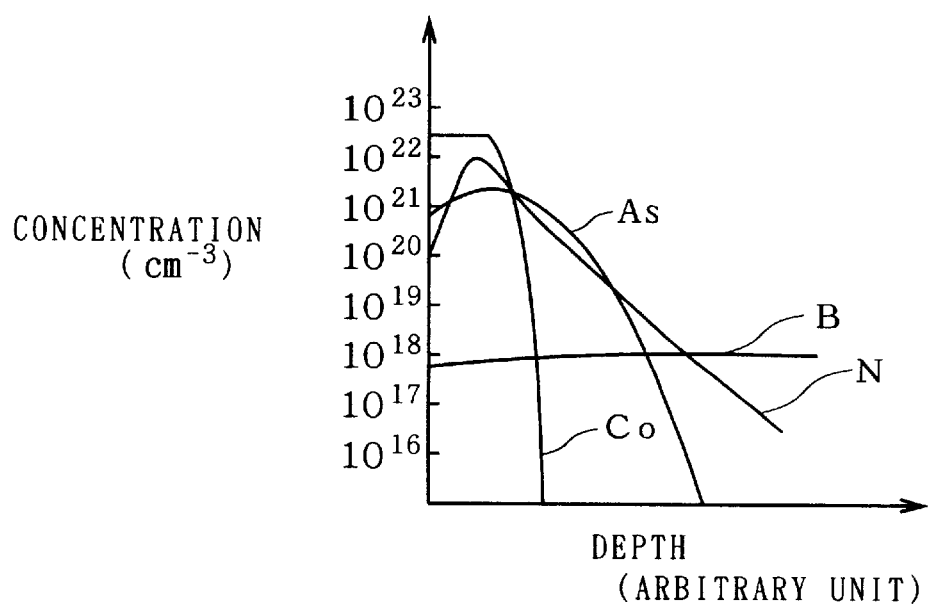
FIG. 2 shows concentration distribution of elements in a certain portion of the semiconductor device according to the first preferred embodiment of the present invention.

FIG. 2 shows concentration distribution of each element in a depth direction taken along a line A—A of FIG. 1. In FIG. 2, the horizontal axis represents depth, and the vertical axis represents concentration. As shown in the figure, portions (or depth) where arsenic and nitrogen concentrations are at its maximum roughly coincide with the junction interface between the metal silicide layer 8 and the source/drain layers 52 (where cobalt concentration is decreasing).

Here, the coincidence of a portion where the arsenic concentration is at its maximum and the junction interface between the metal silicide layer 8 and the source/drain layers 52 is made to form a metal-semiconductor junction in a position where carrier concentration is at its maximum in order to reduce contact resistance.

Though reducing contact resistance, an increase in the arsenic concentration is followed by an increase in crystal defects as well. Thus, to relieve the crystal defects, nitrogen atoms are implanted so that a portion where the nitrogen concentration is at its maximum approximately coincides with to the junction interface between the metal silicide layer 8 and the source/drain layers 52.

The coincidence of a portion where the nitrogen concentration is at its maximum and the junction interface between the metal silicide layer 8 and the source/drain layers 52 is made to relieve stress or distortion in the crystal by doping nitrogen atoms, whose bond length is shorter than that of the silicon atom, into an area including a large number of cobalt or arsenic atoms, whose bond length is longer than that of the silicon atom, in order to prevent crystal defects.

Figure 3:
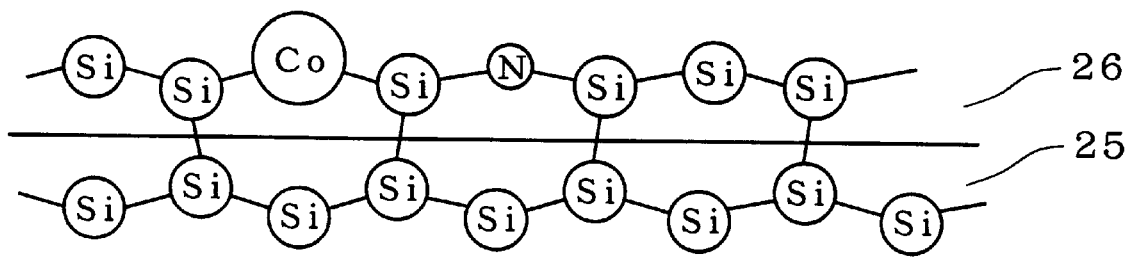
FIG. 3 shows a crystal condition in a predetermined portion of the semiconductor device according to the first preferred embodiment of the present invention.

FIG. 3 schematically shows the vicinity of a junction interface between the cobalt silicide layer and the silicon layer. As shown in FIG. 3, a cobalt silicide layer 26 has a crystal structure with cobalt atoms partially included in a configuration of the silicon atoms. The cobalt atoms included in a silicon layer 25 are in small quantities as compared with that in the cobalt silicide layer 26, and thus not shown. In FIG. 3, a difference of the bond lengths is schematically indicated by the size of circles.

As shown in FIG. 3, the bond length of the cobalt atom is larger than that of the silicon atom, so the inclusion of cobalt atoms changes crystal arrangements. However, as nitrogen atoms are introduced in the vicinity of a junction interface between the silicon layer 25 and the cobalt silicide layer 26, distortion of the crystal arrangements (lattice mismatch) due to the inclusion of cobalt atoms can be relieved by partial inclusion of the nitrogen atoms whose bond length is shorter than that of the silicon atom, in a configuration of the silicon atoms.

Though the silicon layer 25 of FIG. 3 has no impurity, the actual source/drain layers 52 include arsenic. While the arsenic atoms partially included in a configuration of the silicon atoms act to change crystal arrangements, the implanted nitrogen atoms act to relieve lattice mismatch due to the inclusion of cobalt atoms.

Further, the implantation of nitrogen atoms is more effective when its concentration is higher in the cobalt silicide layer 26 than in the silicon layer 25.

Here, concentration ratio of cobalt atoms to nitrogen atoms can be defined as X:(1−X), the concentration ratio X of cobalt atoms expressed by the following equation (1):

$$X = X_0 = \frac{\frac{r1}{rb} - 1}{\frac{ra}{rb} - 1} \qquad (1)$$

In the equation (1), the reference character r1 represents a bond length of a semiconductor atom constituting a semiconductor layer, corresponding to the silicon atom in this case. The reference character ra represents a bond length of an atom which causes distortion of crystal arrangements, corresponding to the cobalt atom in this case. The reference character rb represents a bond length of an atom which is to be implanted in order to relieve distortion of crystal arrangements, corresponding to the nitrogen atom in this case. When the concentration of the cobalt atoms in the metal silicide layer 8 (cobalt silicide layer) is about $2 \times 10^{22}$ cm$^{-3}$, the nitrogen concentration can be found by the equation (1).

In this case, bond lengths of each element employ a correction value of a bond length calculated by a L. C. Pauling method described in "J. C. Phillips, Bonds and Bands in Semiconductors, ACADEMIC PRESS, 1973". According to the reference, the bond lengths of the silicon atom and the nitrogen atom are about 1.173 Å and 0.719 Å, respectively. The bond length of the cobalt atom is assumed to be about 1.4 Å from lattice constant and the like. From this assumption, the concentration ratios of the cobalt and the nitrogen atoms are considered to be about 0.67 and 0.33, respectively. Thus, as described above, the nitrogen concentration should be about $9.9 \times 10^{21}$ cm$^{-3}$.

<Modification>

In the above description, nitrogen is employed to relieve lattice mismatch. This can be substituted by other atoms to have a shorter bond length than the silicon atom and not to cause deterioration in electrical characteristics of the semiconductor device, such as fluorine, neon and carbon.

Taking consideration of a conductivity type of the semiconductor layer in selecting an atom for relieving lattice mismatch prevents deterioration in electrical characteristics of the semiconductor layer. In the above description, the MOSFET 100 is of N type, so that the nitrogen inclusion region 9 is provided in the vicinity of the junction interface between the source/drain layers 52 and the metal silicide layer 8. That is, nitrogen of the V group which can generate an electron when introduced into silicon is useful for the N-type semiconductor layer. On the other hand, an element which can generate a hole when introduced into the semiconductor layer, such as boron in this case, is useful for the P-type MOSFET in order to relieve lattice mismatch.

Further, carbon would not generate a hole and an electron even if introduced into silicon.

Though only referring to the MOSFET in the above description, this is also applicable to other semiconductor devices which have a junction structure of the semiconductor layer and the metal compound layer composed of metals and semiconductors.

Further, though only referring to the semiconductor device with a junction structure of the metal silicide layer and the semiconductor layer (source/drain layer) in the above description, the metal silicide layer may be other metal compound layers composed of semiconductors and metals. When the semiconductor layer includes germanium or carbon, for example, the same problem as described above arises if those elements and metal elements compose a metal compound layer.

<Characteristic Effect>

As the MOSFET 100 includes the nitrogen inclusion region 9 in the vicinity of the junction interface between the source/drain layers 52 and the metal silicide layer 8 as described above, lattice mismatch due to the metal atoms can be relieved, thereby relieving stress and distortion in the crystal and thus preventing crystal defects.

<Second Preferred Embodiment>

<Device Structure>

Figure 4:
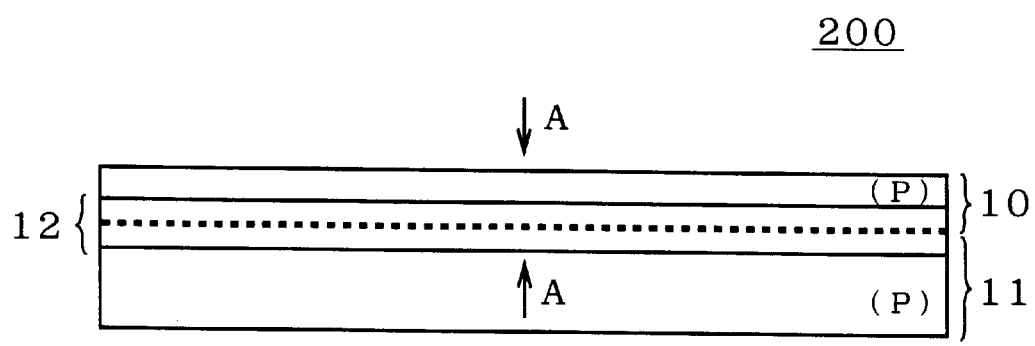
FIG. 4 is a sectional view showing a structure of a semiconductor device according to a second preferred embodiment of the present invention.

FIG. 4 shows a sectional structure of an silicon epitaxial substrate 200 according to a second preferred embodiment of the present invention. In FIG. 4, an epitaxial layer 10 is formed, by epitaxial growth, on a P-type silicon substrate 11 in which boron is doped to a concentration of about $2 \times 10^{20}$ cm$^{-3}$. Boron is also doped in the epitaxial layer 10 to a concentration of about $2 \times 10^{15}$ cm$^{-3}$.

A germanium inclusion region 12 (first element inclusion region) is formed in the vicinity of a junction interface between the silicon substrate 11 and the epitaxial layer 10. The germanium inclusion region 12 is doped with germanium atoms to a maximum concentration of about $4 \times 10^{19}$ cm$^{-3}$.

Figure 5:
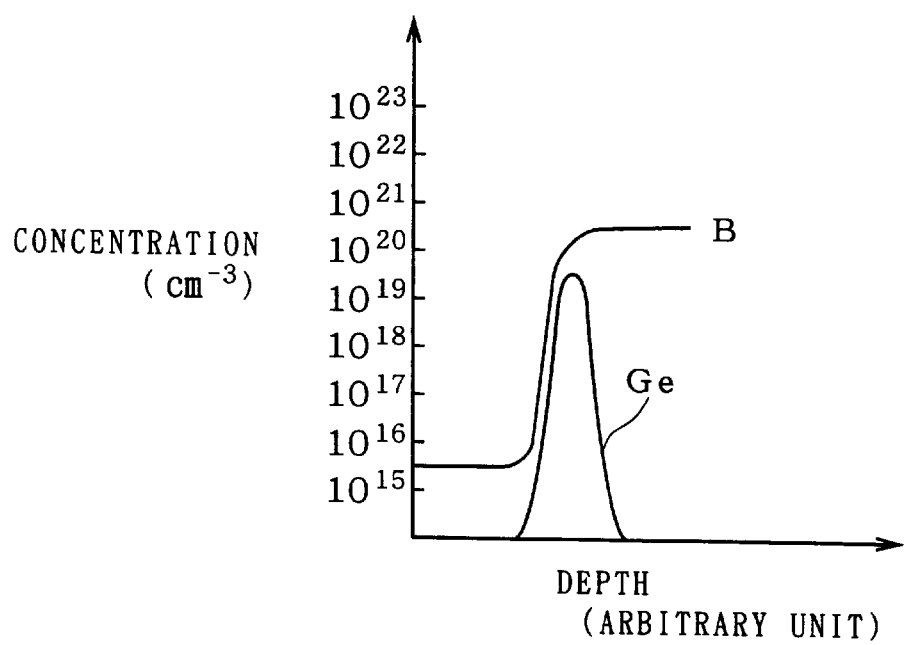
FIG. 5 shows concentration distribution of elements in a predetermined portion of the semiconductor device according to the second preferred embodiment of the present invention.

FIG. 5 shows concentration distribution of each element in a depth direction taken along a line A—A of FIG. 4. The horizontal axis represents depth, and the vertical axis represents concentration. As shown in FIG. 5, germanium is distributed so that germanium concentration is at its maximum in a portion, that is, in the silicon substrate 11, where the boron concentration reaches its maximum.

Figure 13:
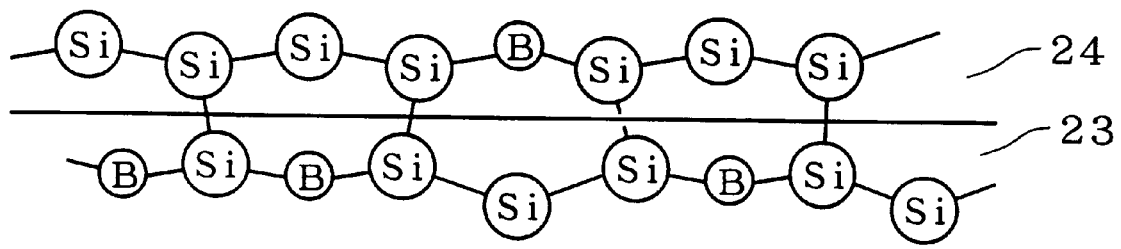
Figure 14:
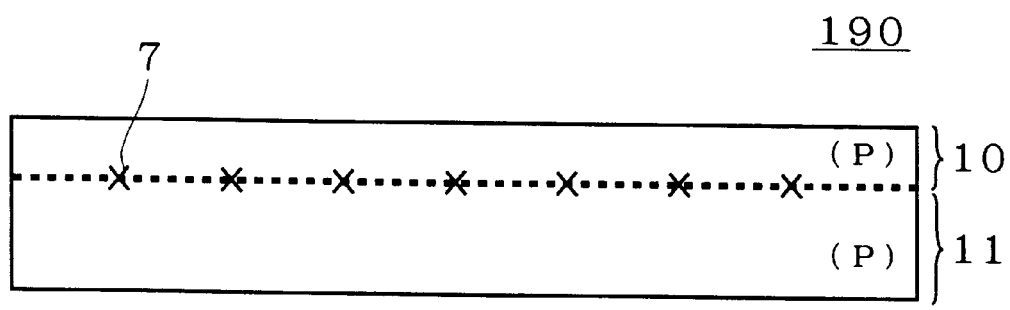
FIG. 14 is a sectional view showing the structure of the conventional semiconductor device.

In the silicon substrate 11 where boron is highly doped, a difference of bond lengths between the silicon atom and the boron atom whose bond length is shorter than that of the silicon atom causes lattice mismatch, as described with reference to FIG. 13. However, this can be relieved by implanting germanium atoms.

Figure 6:
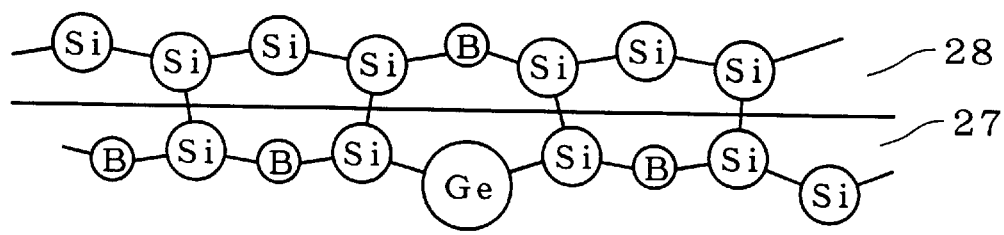
FIG. 6 shows a crystal condition in a predetermined portion of the semiconductor device according to the second preferred embodiment of the present invention.

FIG. 6 schematically shows the vicinity of a junction interface between the silicon substrate and the epitaxial layer. As shown in FIG. 6, a silicon substrate 27 includes an impurity (boron in this case) much more than an epitaxial layer 28. The germanium atoms in the epitaxial layer 28 is in small quantities as compared with that in the silicon substrate 27, and thus not shown. In FIG. 6, a difference of the bond lengths is indicated by the size of circles.

As the bond length of the boron atom is shorter than that of the silicon atom, crystal arrangements differ between the silicon substrate 27 including a large number of boron atoms, and the epitaxial layer 28 including a small number of them. However, lattice mismatch due to the inclusion of boron atoms can be relieved by germanium atoms which are introduced in the vicinity of a junction interface between the silicon substrate 27 and the epitaxial layer 28 and whose bond length is longer than that of the silicon atom.

The concentration ratio of the germanium atom to the boron atom in the epitaxial layer 28 can be defined as X:(1−X), the concentration ratio X of the germanium atom expressed by the equation (1) given in the first preferred embodiment.

In the equation (1) according to this preferred embodiment, the reference character r1 represents a bond length of the semiconductor atom constituting the semiconductor layer, corresponding to the silicon atom in this case. The reference character ra represents a bond length of an atom which causes distortion of crystal arrangements, corresponding to the boron atom in this case. The reference character rb represents a bond length of an atom which is implanted in order to relieve the distortion of crystal arrangements, corresponding to the germanium atom in this case. Thus, when the boron concentration in the silicon substrate 11 is about $2 \times 10^{20}$ cm$^{-3}$, the germanium concentration can be found by the equation (1).

In this case, the correction value of a bond length, calculated by the L. C. Pauling method described in the first preferred embodiment, is employed as the bond lengths of each element. According to the method, the bond lengths of the germanium and the boron atoms are about 1.225 Å and 0.853 Å, respectively, and the concentration ratio of the germanium atom is about 0.14. Thus, as described above, the germanium concentration should be about $4 \times 10^{19}$ cm$^{-3}$.

Though a semiconductor element is not formed in the epitaxial substrate 200 of FIG. 4, an element such as a FET and a bipolar transistor is, of course, formed in the epitaxial layer 10.

<Modification>

According to the second preferred embodiment of the present invention, lattice mismatch can be relieved by implanting a large number of germanium atoms into the silicon substrate 11. Those atoms can be implanted into the epitaxial layer 10 instead the silicon substrate 11.

Furthermore, taking consideration of a conductivity type of the semiconductor layer in selecting an atom for relieving lattice mismatch prevents deterioration in electrical characteristics of the semiconductor layer. That is, as the silicon substrate 27 described above is of P type, the use of an element such as gallium and indium which generates holes when introduced into the semiconductor layer is effective at preventing deterioration in electrical characteristics of the silicon substrate 27.

On the other hand, when the silicon substrate is of N type, an element, such as arsenic and antimony, which generates electrons when introduced into the semiconductor layer is employed to prevent deterioration in electrical characteristics of the N-type silicon substrate.

Further, germanium would not generate an electron and a hole even if introduced in silicon.

The epitaxial substrate 200 described above has a structure with the P-type epitaxial layer 11 formed on the P-type silicon substrate 10 of high concentration. Even if the epitaxial substrate 200 has a structure with an N-type epitaxial layer formed on an N-type silicon substrate of high concentration, deterioration in electrical characteristics can be prevented by an appropriate selection of an atom for relieving lattice mismatch.

This also applies in the case where the silicon substrate and the epitaxial layer are of different conductivity types.

According to the above description, when the bond length of an impurity atom in the semiconductor substrate is shorter than that of an atom constituting the semiconductor substrate, an atom whose bond length is longer than that of an atom constituting the semiconductor substrate is employed to relieve lattice mismatch. Thus, when the bond length of an impurity atom in the semiconductor substrate is longer than that of an atom constituting the semiconductor substrate, an atom whose bond length is shorter than that of an atom constituting the semiconductor substrate would be employed to obtain the same effect.

When the semiconductor substrate consists of silicon, and the impurity atom therein is arsenic, for example, nitrogen may be used for relieving lattice mismatch.

Moreover, a diamond-type substrate (C substrate) may be used for the epitaxial substrate 200 instead of the silicon substrate described above.

<Manufacturing Process>

An example of a manufacturing process of the epitaxial substrate 200 appears in FIGS. 7 to 10.

Figure 7:
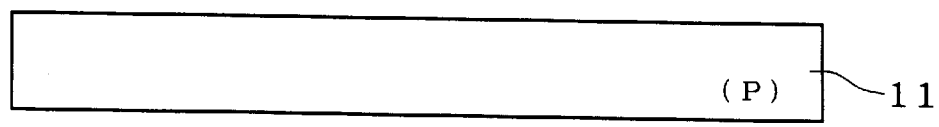
FIGS. 7 through 10 are sectional views showing the steps of manufacturing the semiconductor device according to the second preferred embodiment of the present invention.

As shown in FIG. 7, a P-type silicon substrate 11, in which boron is doped to an average concentration of about $2 \times 10^{20}$ cm$^{-3}$, is prepared. The detail is omitted as the manufacturing method of the silicon substrate 11 is well-known.

Figure 8:
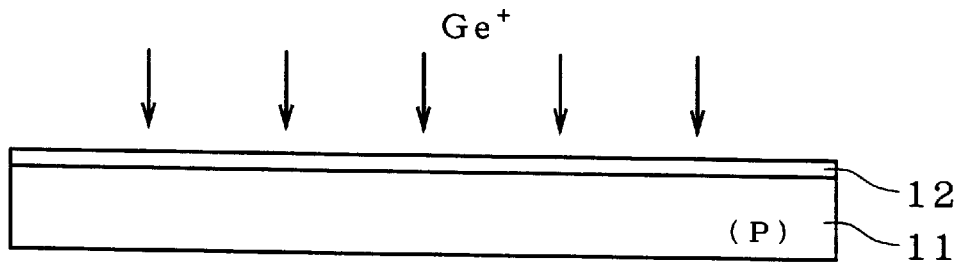

In the step shown in FIG. 8, a germanium inclusion region 12 is formed in a surface of the silicon substrate 11 by implanting germanium ions, for example, at an energy of 20 keV at a dose of $5 \times 10^{17}$ cm$^{-2}$.

Figure 9:
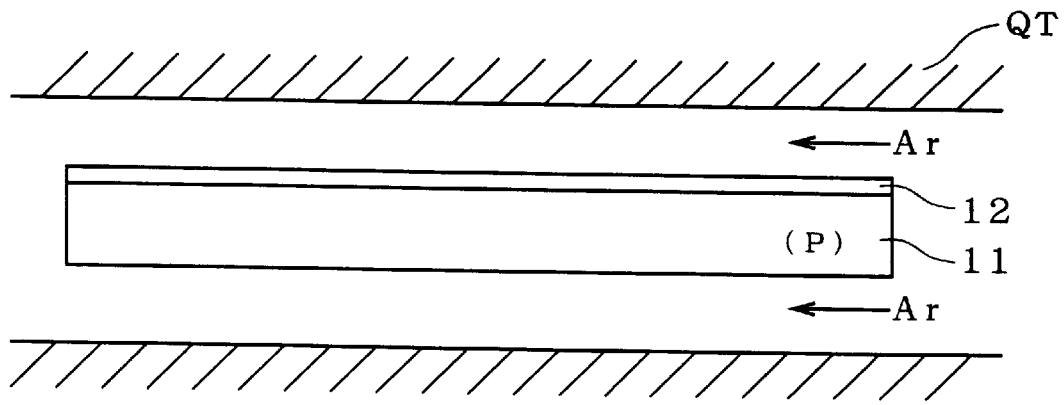

Next, in the step shown in FIG. 9, in order to recover a surface damage of the silicon substrate 11 caused by the germanium ion implantation, the germanium-implanted silicon substrate 11 is deposited in a quartz tube QT of an electric furnace. Then, a 30 minute thermal processing is performed at about 1000° C. with a flow of argon gas in atmospheric pressure. The thermal processing may be performed by other methods, for example, a rapid thermal annealing (RTA) by a lamp anneal furnace in order to shallow a diffusion depth of the germanium atoms.

Alternatively, the thermal processing is not necessary if the damage due to the germanium ion implantation is not so serious.

Figure 10:
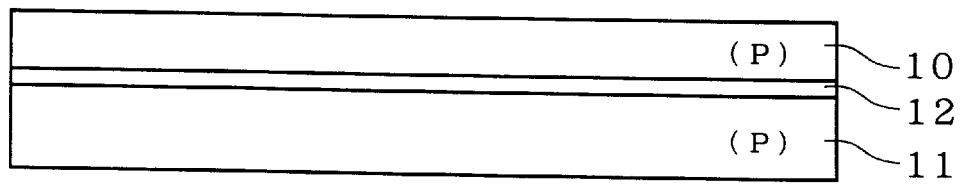
Figure 11:
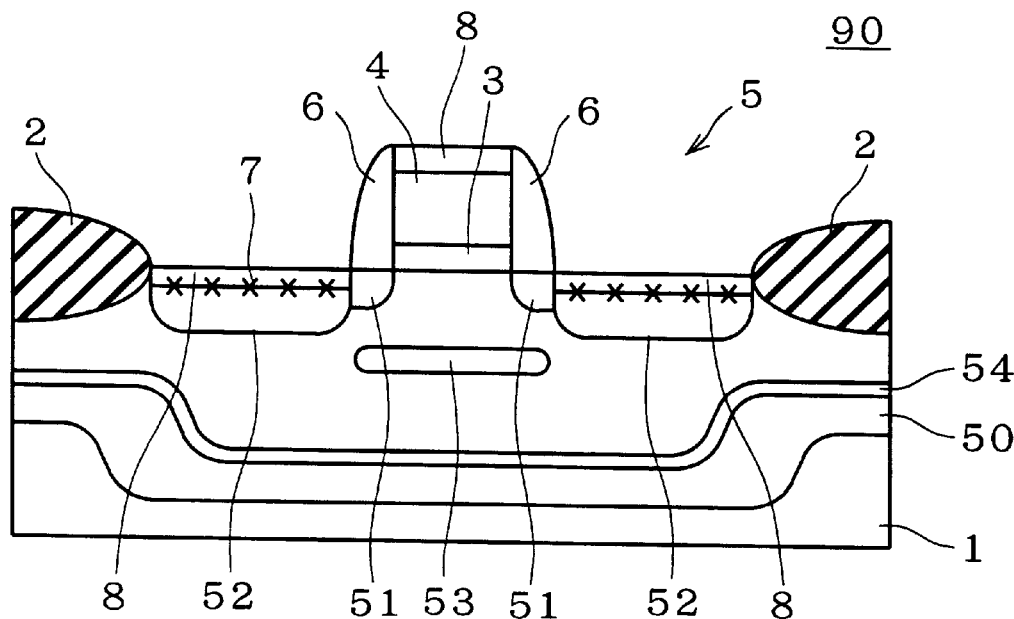
FIG. 11 is a sectional view showing a structure of the conventional semiconductor device.
Figure 12:
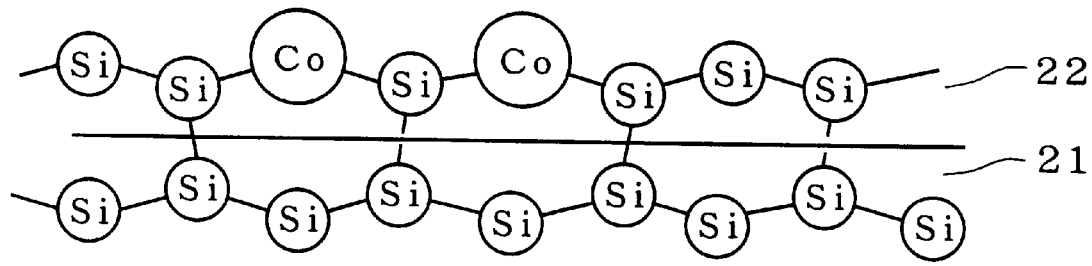
FIGS. 12 and 13 are schematic views showing a crystal condition in a predetermined portion of the conventional semiconductor device.

Then, in the step shown in FIG. 10, an epitaxial layer 10 is formed, by epitaxial growth, on the germanium-implanted silicon substrate 11. The epitaxial growth is attained by an atmospheric pressure CVD method in which SiH$_4$ gas and H$_2$ gas flow in the ratio 2:1 so that the epitaxial layer grows about 2 μm in thickness at 1000° C.

On this heating, the boron and germanium atoms are diffused from the silicon substrate 11 to the epitaxial layer 10 by autodoping to form the epitaxial substrate 200 as shown in FIG. 4.

The epitaxial layer 10 may be formed by other methods as well. In order to minutely control the impurity concentration (boron concentration in this case), for example, in-situ doping, which applies gas B$_2$H$_6$ including an impurity besides gas such as SiH$_4$ to form a silicon layer by a CVD method, is effective.

Besides the above-described steps, the following step may be added to improve characteristics of the epitaxial substrate 200.

Following to the step shown in FIG. 9, thermal processing (hydrogen anneal) is performed at 1000° C. under gaseous hydrogen atmosphere (H$_2$), bringing about further recovery of crystal defects.

Further, a film forming step of the epitaxial layer 10 may be separately performed, not at a time.

Further, in order to prevent contamination of the substrate and form a clear one, a cleaning step by a wet or dry process would be effective.

Further, when the substrate requires a plane surface, a planar processing such as a mirror grinding processing by chemical machinery grinding would be effective.

<Characteristic Feature>

As described above, the epitaxial substrate 200 includes the germanium inclusion region 12 in the vicinity of the junction interface between the silicon substrate 11 and the epitaxial layer 10. Thus, lattice mismatch due to the impurity atom can be relieved, thereby relieving stress or distortion in the crystal and preventing crystal defects caused by misfit dislocations. Therefore, it becomes possible to prevent deterioration in carrier lifetime in the epitaxial layer 10 and an increase of leakage voltage.

While the invention has been described in detail, the foregoing description is in all aspects illustrative and not restrictive. It is understood that numerous other modifications and variations can be devised without departing from the scope of the invention.

I claim:

1. A semiconductor device comprising:

a junction structure of a crystalline semiconductor layer and a metal compound layer composed of a metal element and a semiconductor element constituting said semiconductor layer; and a first element inclusion region with a first element introduced in the vicinity of a junction interface between said semiconductor layer and said metal compound layer, said first element having a bond length shorter than that of said semiconductor element and having characteristics that the presence of said first element does not cause deterioration in electrical characteristics of said semiconductor layer and relieves crystal distortion in said vicinity of said junction interface.

2. The semiconductor device of claim 1, wherein a concentration ratio between said metal element and said first element is defined as X:(1−X), and the concentration ratio X of said metal element is expressed by the following equation (1);

$$X = X_0 = \frac{\frac{r1}{rb} - 1}{\frac{ra}{rb} - 1} \quad (1)$$

where r1, ra and rb are bond lengths of said semiconductor element, said metal element and said first element, respectively.

3. The semiconductor device of claim 1, wherein said first element includes an element which generates an electron or a hole when introduced into said semiconductor layer.

4. The semiconductor device of claim 1, wherein said first element includes an element which would not generate an electron and a hole when introduced into said semiconductor layer.

5. The semiconductor device of claim 1, wherein said first element includes an element which is an element of group IV in the periodic table.

6. The semiconductor device of claim 1, wherein, said first element inclusion region has concentration distribution of said first element higher in said metal compound layer than in said semiconductor layer.

7. A semiconductor device comprising:

a first semiconductor layer of relatively high impurity concentration;

a second semiconductor layer of relatively low impurity concentration, formed on the whole surface of said first semiconductor layer so that said second semiconductor layer has substantially the same crystallinity as said first semiconductor layer; and a first element inclusion region with a first element introduced in the vicinity of a junction interface between said first and said second semiconductor layers, said first element having a bond length longer than that of a semiconductor element which constitutes said first semiconductor layer, and having a characteristic that the presence of said first element does not cause deterioration in electrical characteristics of said semiconductor layers, wherein said first semiconductor layer includes an impurity element whose bond length is shorter than that of said semiconductor element.

8. The semiconductor device of claim 7, wherein a concentration ratio between said first element and said impurity element is defined as X:(1−X), and the concentration ratio X of said first element is expressed by the following equation (1);

$$X = X_0 = \frac{\frac{r1}{rb} - 1}{\frac{ra}{rb} - 1} \quad (1)$$

where r1, ra and rb are bond lengths of said semiconductor element, said first impurity element and said first element, respectively.

9. The semiconductor device of claim 7, wherein said first element includes an element which generates an electron or a hole when introduced into said first and said second semiconductor layers.

10. The semiconductor device of claim 7, wherein said first element includes an element which would not generate an electron and a hole when introduced into said first and said second semiconductor layers.

11. The semiconductor device of claim 7, wherein said first element includes an element which is an element of group IV in the periodic table.

12. A semiconductor device comprising:

a first semiconductor layer of relatively high impurity concentration, which is crystalline;

a second semiconductor layer of relatively low impurity concentration, formed on the whole surface of said first semiconductor layer so that said second semiconductor layer has substantially the same crystallinity as said first semiconductor layer; and a first element inclusion region with a first element introduced in the vicinity of a junction interface between said first and said second semiconductor layers, the first element having a bond length shorter than that of a semiconductor element which constitutes said first semiconductor layer, and having a characteristic that the presence of said first element does not cause deterioration in electrical characteristics of said semiconductor layers, wherein said first semiconductor layer includes an impurity element whose bond length is longer than that of said semiconductor element.

13. The semiconductor device of claim 12, wherein a concentration ratio between said first element and said first impurity element is defined as X:(1−X), and the concentration ratio X of said first element is expressed by the following equation (1);

$$X = X_0 = \frac{\frac{r1}{rb} - 1}{\frac{ra}{rb} - 1} \quad (1)$$

where r1, ra and rb are bond lengths of said semiconductor element, said first impurity element and said first element, respectively.

14. The semiconductor device of claim 12, wherein said first element includes an element which generates an electron or a hole when introduced into said first and said second semiconductor layers.

15. The semiconductor device of claim 12, wherein said first element includes an element which would not generate an electron and a hole when introduced into said first and said second semiconductor layers.

16. The semiconductor device of claim 12, wherein said first element includes an element which is an element of group IV in the periodic table.

* * * * *